United States Patent
Wu et al.

(10) Patent No.: US 6,933,600 B2
(45) Date of Patent: Aug. 23, 2005

(54) SUBSTRATE FOR SEMICONDUCTOR PACKAGE

(75) Inventors: Chung Ju Wu, Kaohsiung (TW); Kuei Chen Liang, Hsinchu (TW); Wei Feng Lin, Hsinchu (TW)

(73) Assignee: Silicon Integrated Systems Corp. (TW)

( * ) Notice: Subject to any disclaimer, the term of this patent is extended or adjusted under 35 U.S.C. 154(b) by 212 days.

(21) Appl. No.: 10/152,191

(22) Filed: May 20, 2002

(65) Prior Publication Data

US 2003/0160294 A1 Aug. 28, 2003

(30) Foreign Application Priority Data

Feb. 26, 2002 (TW) .......................................... 91103516 A

(51) Int. Cl.[7] .............................................. H01L 23/48
(52) U.S. Cl. ....................... 257/691; 257/786; 257/459; 257/690; 257/692
(58) Field of Search ................................ 257/690–692, 257/459, 786, 737, 684, 688, 693, 780

(56) References Cited

U.S. PATENT DOCUMENTS

| | | | | |
|---|---|---|---|---|
| 5,151,769 A | * | 9/1992 | Immorlica et al. | 257/659 |
| 5,801,440 A | * | 9/1998 | Chu et al. | 257/691 |
| 5,895,967 A | * | 4/1999 | Stearns et al. | 257/691 |
| 5,955,789 A | * | 9/1999 | Vendramin | 257/786 |
| 6,291,898 B1 | * | 9/2001 | Yeh et al. | 257/786 |
| 6,307,271 B1 | * | 10/2001 | Nakamura | 257/786 |
| 6,316,828 B1 | * | 11/2001 | Tao et al. | 257/723 |
| 6,410,990 B2 | * | 6/2002 | Taylor et al. | 257/786 |
| 6,424,032 B1 | * | 7/2002 | Ikemoto et al. | 257/691 |
| 6,426,468 B1 | * | 7/2002 | Utsunomiya et al. | 174/261 |
| 6,433,441 B1 | * | 8/2002 | Niwa et al. | 257/784 |
| 6,452,266 B1 | * | 9/2002 | Iwaya et al. | 257/723 |
| 6,477,046 B1 | * | 11/2002 | Stearns et al. | 361/704 |
| 6,534,879 B2 | * | 3/2003 | Terui | 257/786 |
| 6,583,365 B2 | * | 6/2003 | Chang | 174/260 |
| 6,762,507 B2 | * | 7/2004 | Cheng et al. | 257/786 |

* cited by examiner

*Primary Examiner*—Tom Thomas
*Assistant Examiner*—Eugene Lee
(74) *Attorney, Agent, or Firm*—Martine Penilla & Gencarella, LLP

(57) ABSTRACT

The invention provides a semiconductor package substrate, which includes a substrate, a chip contact area, an inner pad portion, an outer pad portion and a conductive layer. The chip contact area, the inner pad portion, the outer pad portion and the conductive layer are formed on one side of the substrate, wherein the outer pad portion encloses the inner pad portion that surrounds the chip contact area in the center of the substrate. The inner pad portion and the outer pad portion contain a plurality of signal pads and a plurality of shielding pads respectively, while the conductive layer and each of the shielding pads are electrically connected.

5 Claims, 6 Drawing Sheets

SUBSTRATE FOR SEMICONDUCTOR PACKAGE

BACKGROUND OF THE INVENTION

1. Field of the Invention

The invention relates to a semiconductor package substrate and, more particularly, to a semiconductor package substrate that supports a semiconductor chip when the semiconductor chip is being packaged.

2. Description of the Related Art

In the field of semiconductor packaging technique, because the semiconductor integration has been dynamically enhanced, and because the design of semiconductor chips has been developed in the direction of function integration, many products of system on chip (SOC) then have been introduced one by one. At the same time, by strengthening the data calculation processing ability of semiconductor products, the demand of I/O pads, which are indispensable on semiconductor chips, has relatively been increased. Therefore, the technique of semiconductor packaging must be in accord with the requirements of semiconductor development.

In recent years, due to fast development of very large scale integration (VLSI) technology or even ultra large scale integration (ULSI) technology, the semiconductor packaging products and techniques that are of high density and of high pin count have been relatively enhanced. That is, the demand for the contact number of the semiconductor package substrate has been gradually increasing, and correspondingly, the density and the area of wiring on the semiconductor package substrate have been increased as well. However, along with the increase in the operating frequency of integrated circuits, the problem with the adjacent signals interfering with one another on the transmitting path becomes more obvious. Therefore, providing shielding pads among the signal pads that are used for transmitting signals are required in order to separate adjacent signal pads thereby reducing the cross-talk among the adjacent signals.

As shown in FIG. 1, the conventional semiconductor package substrate includes a substrate 11, a chip contact area 12, an inner pad portion 13 and an outer pad portion 14. In the conventional semiconductor package substrate, the chip contact area 12 is formed in the center of one side of substrate 11, the inner pad portion 13 is formed on one side of substrate 11 and locates on the periphery of the chip contact area 12, and the outer pad portion 14 is formed on the periphery of the inner pad 13. Each of the outer pad portion 14 and the inner pad 13 includes a plurality of signal pads 15 and a plurality of shielding pads 16, as shown in FIG. 2. The signal pads 15 are electrically connected to the die pads of a semiconductor chip separately by wire bonding. In addition, the signal pads 15 and the shielding pads 16, each through a plurality of via holes 17 that are formed in the substrate 11, are electrically connected to the solder balls that are formed on the other side of the substrate 11. The signal pads 15 input signals to or output signals from external devices through the solder balls, while the shielding pads 16 protect the adjacent signal pads 15 thereof by grounding the solder balls, which prevents adjacent signals from interfering with one another when the signals are transmitted on each of the signal pads 15.

However, because providing the via holes 17 on each of the shielding pads 16 is a must, a large portion of the area of the semiconductor package substrate is occupied by the via holes 17, especially the area on the periphery of the inner pad 13, which has only very limited area for use. Consequently, the existence of the via holes 17 limits the quantity of signal pads 15 and shielding pads 16 that can be provided.

To sum up, since the area on the surface of the semiconductor package substrate is limited, and since the indispensable via holes must occupy a large portion of the area, it is an important task for the current package technique to provide a semiconductor package substrate that can reduce the quantity of via holes formed on the limited area, thereby increasing the quantity of the signal pads and the shielding pads.

SUMMARY OF THE INVENTION

The object of the invention is to provide a semiconductor package substrate that can reduce the number of via holes in order to increase the quantity of die pads.

The invention provides a semiconductor package substrate, which includes a substrate, a chip contact area, an inner pad portion, an outer pad portion and a conductive layer. The chip contact area, the inner pad portion, the outer pad portion and the conductive layer are formed on one side of the substrate, wherein the outer pad portion encloses the inner pad portion that surrounds the chip contact area in the center of the substrate. The inner pad portion and the outer pad portion contain a plurality of signal pads and a plurality of shielding pads respectively, while the conductive layer and each of the shielding pads are electrically connected.

According to the present invention, a plurality of solder balls are formed on the other side of the substrate, and a plurality of via holes are formed in the substrate. Each of the signal pads electrically connects to solder balls through via holes individually. Moreover, a ground via hole grounding all shielding pads is formed in the substrate in order to prevent adjacent signals interference between signal pads.

As mentioned in the above, the present invention utilizes a conductive layer to electrically connect to each shielding pad, therefore, the quantity of the via holes can be reduced, whereas the quantity of the die pads can then be increased.

DESCRIPTION OF THE PREFERRED EMBODIMENTS

Figure 1:
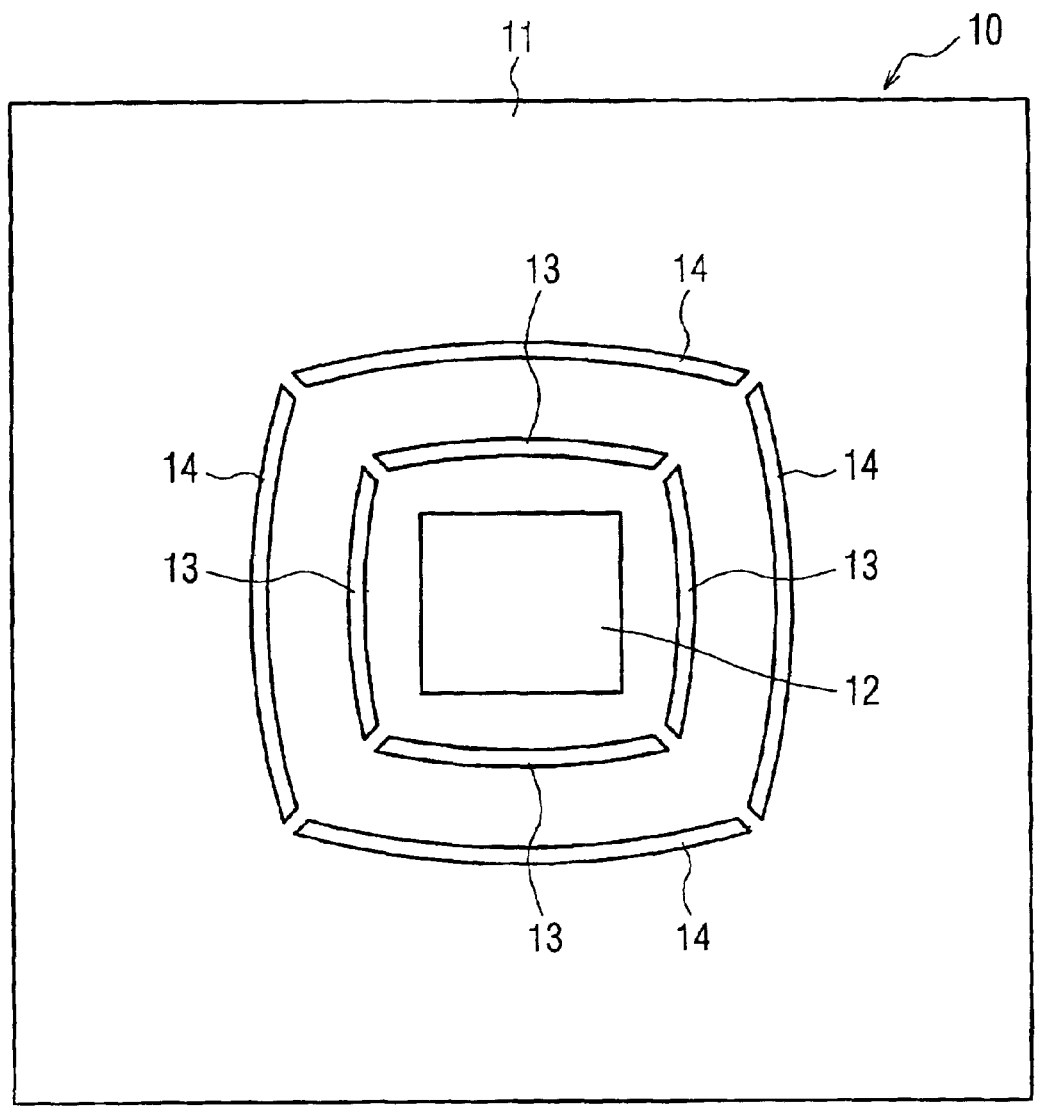
FIG. 1 is a schematic diagram showing the layout of the surface pattern of a conventional semiconductor package substrate.
Figure 2:
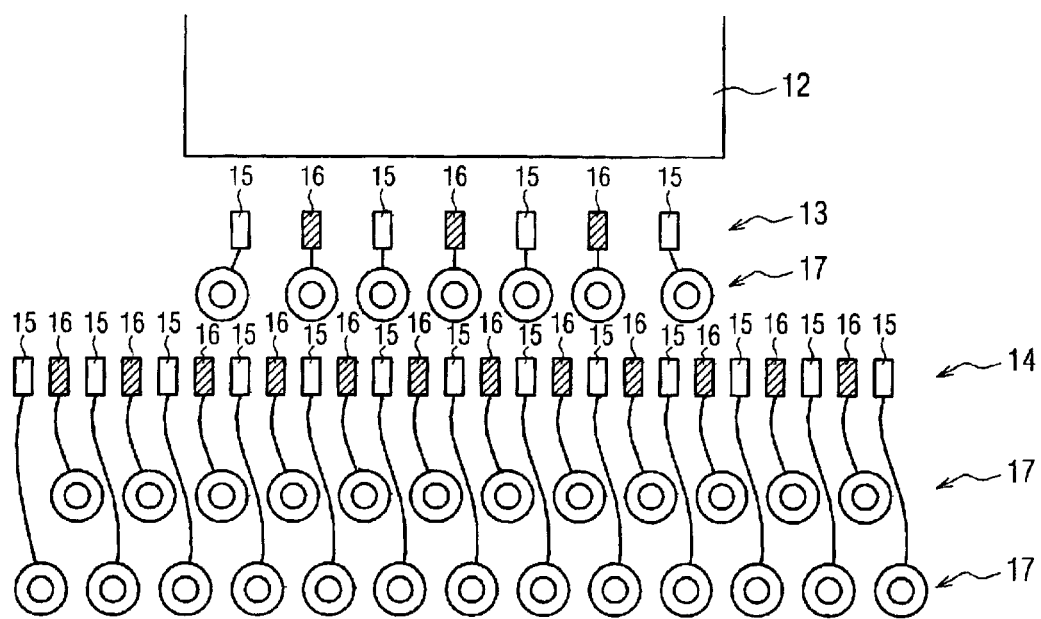
FIG. 2 is a schematic diagram showing part of the inner pad portion and part of the outer pad portion, and the diagram is a partial schematic diagram of the semiconductor package substrate shown in FIG. 1.

A semiconductor package substrate according to one preferred embodiment of the invention will be described below with reference to the drawings, wherein the same components will be referred by the same reference numerals.

Figure 3:
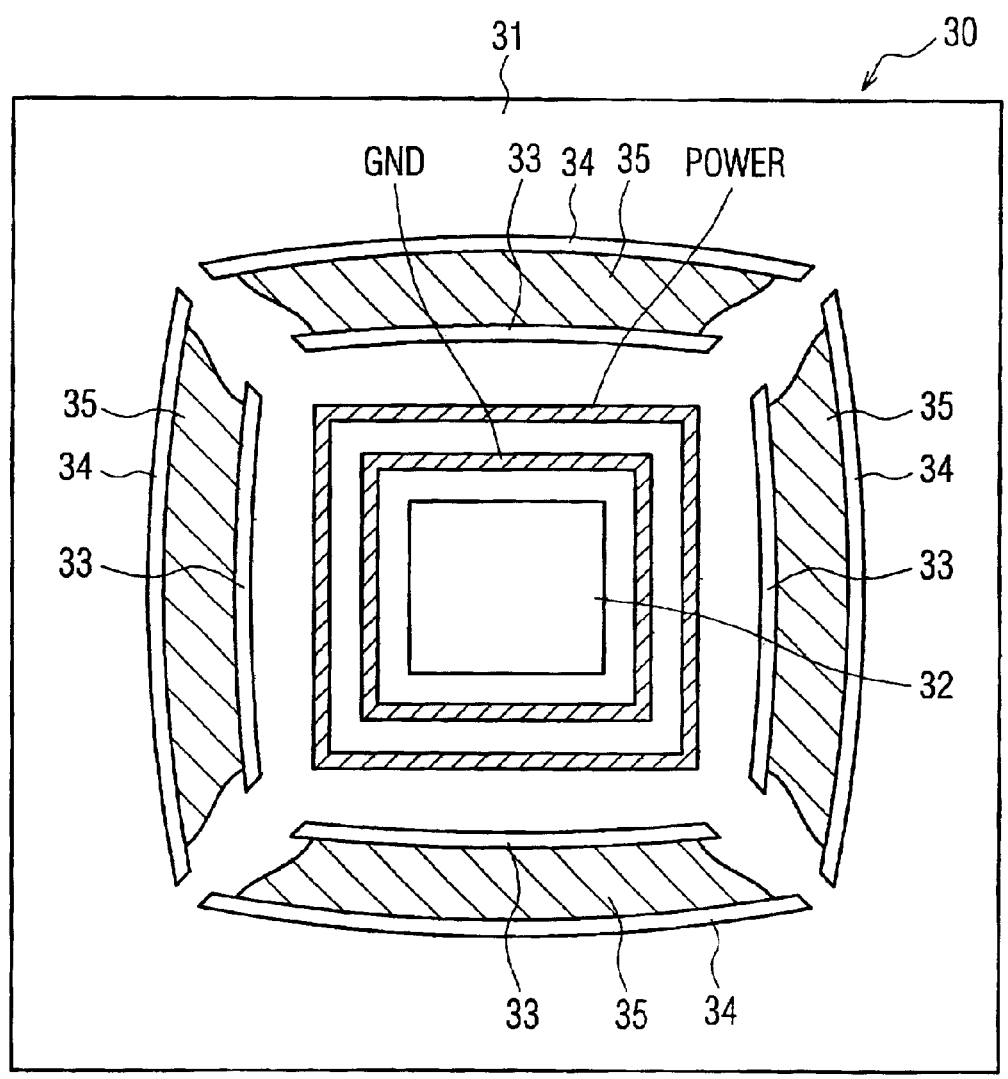
FIG. 3 is a schematic diagram showing the layout of the surface pattern of a semiconductor package substrate according to one preferred embodiment of the present invention.

With reference to FIG. 3, a semiconductor package substrate 30 according to one preferred embodiment of the invention includes a substrate 31, a chip contact area 32, an inner pad portion 33, an outer pad portion 34 and a conductive layer 35.

In the embodiment, the chip contact area 32 is formed in the center of one side of the substrate 31. Those skilled in the art should understand that the chip contact area 32 is provided with a plurality of die pads (not shown) to support a semiconductor chip for conducting part of the die pads of the semiconductor chip.

In addition, on the periphery of the chip contact area 32, usually a ground ring GND and a power ring POWER are formed respectively, so as to separately provide the ground voltage and the supply voltage to the above-mentioned semiconductor chips, while the ground ring GND and the power ring POWER are electrically connected to the solder balls at the other side of the substrate 31 separately through a via hole (not shown), and are further electrically connected to a ground terminal and a supply voltage from external devices. It should be noted that a plurality of ground rings GND and power rings POWER can be formed on the periphery of the chip contact area 32, and each of the ground rings GND and the power rings POWER can be electrically connected to the solder balls through via holes.

The inner pad portion 33 is formed to surround the chip contact area 32, the ground ring GND and the power ring POWER. The outer pad portion 34 is formed to enclose the inner pad portion 33, and the conductive layer 35 is formed between the outer pad portion 34 and the inner pad portion 33. Those skilled in the art should understand that the outer pad portion 34 and the inner pad portion 33 are electrically connected to the die pads of the semiconductor chip through a plurality of bonding wires, in order to proceed with the input/output of the signals. In the embodiment, the conductive layer 35 can be formed by copper process; that is, the conductive layer 35 can be made of copper.

Figure 4:
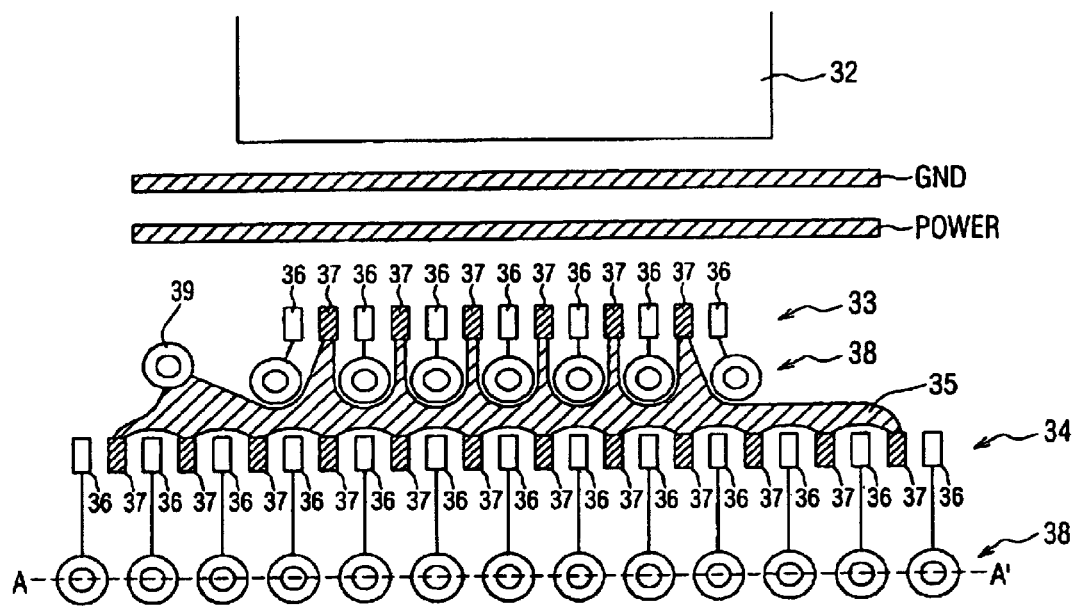
FIG. 4 is a schematic diagram showing part of the inner pad portion, part of the outer pad portion, and part of the conductive layer, and the diagram is a partial schematic diagram of the semiconductor package substrate according to one preferred embodiment of the present invention.

As shown in FIG. 4, the inner pad portion 33 and the outer pad portion 34 contain a plurality of signal pads 36 and a plurality of shielding pads 37, respectively. The signal pads 36 and the shielding pads 37 are alternately disposed, and the conductive layer 35 is electrically connected to the shielding pads 37. Therefore, the shielding pads 37 can shield each of the signal pads 36 from the interference caused by adjacent signals when they are transmitted on each of the signal pads 36. Additionally, those skilled in the art should understand that usually the signal pads 36 and the shielding pads 37 are conventional gold fingers. Therefore, the inner pad portion 33 may also be the inner finger portion, and the outer pad portion 34 may also be the outer finger portion.

Figure 6:
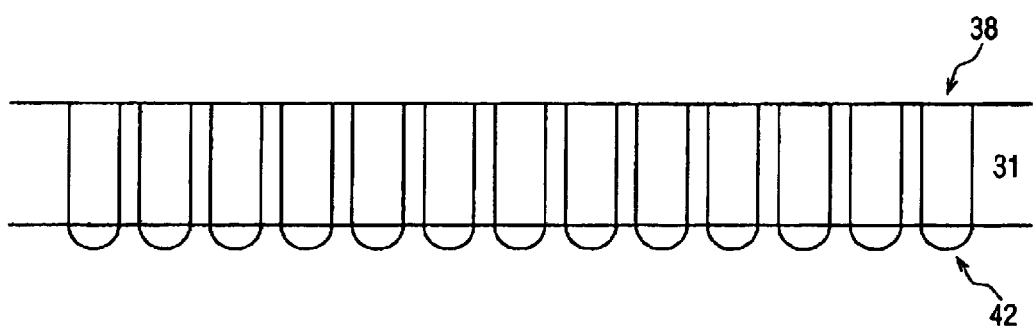
FIG. 6 is a sectional view of line A–A' in FIG. 4.

Furthermore, a plurality of signal via holes 38 are formed in the substrate, so each of the signal pads 36 is able to be electrically connected to the solder balls (not shown) through each of the signal via holes 38, while the solder balls are located at the other side of the substrate 31. FIG. 6 is a sectional view of line A–A' in FIG. 4. As shown in FIG. 6, a plurality of signal via holes 38 are formed in the substrate 31. Each of the signal via holes 38 are electrically connected to each of the solder balls 42, located at the other side of the substrate 31.

Next, the shielding pads 37 must be grounded so that they are able to shield each of the signal pads 36. In the embodiment, each of the shielding pads 37 is electrically connected to the conductive layer 35, as shown in FIG. 4. A ground via hole 39 is formed on the substrate and is electrically connected to the conductive layer 35 directly, and then the ground via hole 39 is further connected to a ground terminal from external devices, through the solder balls located at the other side of the substrate 31, thereby providing ground voltage to the conductive layer 25, so that the shielding pads 37 can be grounded through the conductive layer 35.

Figure 5:
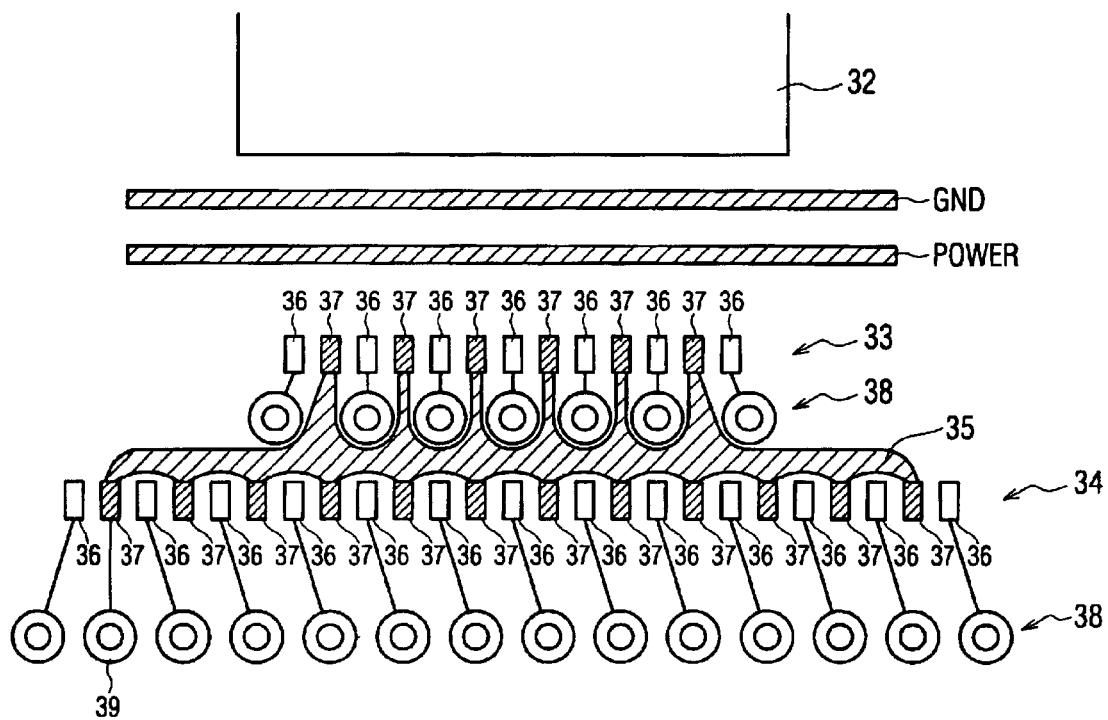
FIG. 5 is a schematic diagram showing part of the inner pad portion, part of the outer pad portion, and part of the conductive layer, and the diagram is a partial schematic diagram of the semiconductor package substrate according to another preferred embodiment of the present invention.

Besides, in another preferred embodiment according to the invention, the shielding pads 37 are electrically connected to the conductive layer 35 separately, as shown in FIG. 5, while the ground via hole 39 is electrically connected to one of the shielding pads. Therefore, the rest of the shielding pads can be electrically connected to the ground via hole 39 through the conductive layer 35, thereby grounding the shielding pads 37.

It should be noted that although only one ground via hole 39 is used in the above-mentioned embodiment, its quantity can be increased to several ground via holes 39 as needed (not shown), so that the distance between each shielding pad and the solder ball can be shortened, to ensure the shielding effect that each of the shielding pad 37 applies to each of the signal pad 36.

As mentioned in the above, the semiconductor package substrate according to the invention provides a conductive layer electrically connected to each shielding pad, which makes each of the shielding pads grounded by using a ground via hole only, so there is no need to dispose a ground via hole for each of the shielding pads. Therefore, the quantity of the ground via holes can be reduced. On the other hand, the quantity of the via holes of the signal pads can be increased, so the quantity of the signal pads can be increased as well.

The above-described embodiment should be considered in all respects as illustrative and not restrictive. Any modifications and changes made to the invention should be included in the appended claims without departing from the spirit and scope of the invention as set forth in the appended claims.

What is claimed is:

1. A semiconductor package substrate comprising:

a substrate;

a chip contact area on one side of the substrate;

an inner pad portion having a plurality of signal pads and a plurality of shielding pads surrounding the chip contact area;

an outer pad portion having a plurality of signal pads and a plurality of shielding pads enclosing the inner pad portion; and a conductive layer electrically connecting to each of the shielding pads;

wherein the shielding pads are alternately disposed with the signal pads to shield each of the signal pads.

2. The semiconductor package substrate as claimed in claim 1, wherein a plurality of solder balls are formed on the other side of the substrate, a plurality of via holes are formed in the substrate, and each of the signal pads electrically connects to solder balls through via holes individually.

3. The semiconductor package substrate as claimed in claim 1, wherein a ground via hole grounding all shielding pads to the conductive layer is formed in the substrate.

4. The semiconductor package substrate as claimed in claim 1, wherein the conductive layer is made of copper.

5. The semiconductor package substrate as claimed in claim 1, wherein the chip contact area is located in the center of one side of the substrate.

* * * * *